United States Patent
Kardasz et al.

(10) Patent No.: US 10,879,454 B2
(45) Date of Patent: Dec. 29, 2020

(54) MAGNETIC TUNNEL JUNCTION MEMORY ELEMENT WITH IMPROVED REFERENCE LAYER STABILITY FOR MAGNETIC RANDOM ACCESS MEMORY APPLICATION

(71) Applicant: Spin Transfer Technologies, Inc., Fremont, CA (US)

(72) Inventors: Bartlomiej Adam Kardasz, Pleasanton, CA (US); Cheng Wei Chiu, Dublin, CA (US); Jorge Vasquez, San Jose, CA (US); Mustafa Pinarbasi, Morgan Hill, CA (US)

(73) Assignee: SPIN MEMORY, INC., Fremont, CA (US)

( * ) Notice: Subject to any disclaimer, the term of this patent is extended or adjusted under 35 U.S.C. 154(b) by 91 days.

(21) Appl. No.: 16/058,836

(22) Filed: Aug. 8, 2018

(65) Prior Publication Data
US 2020/0052034 A1 Feb. 13, 2020

(51) Int. Cl.
*H01L 27/22* (2006.01)
*H01L 43/02* (2006.01)
*H01L 43/10* (2006.01)
*G11C 11/16* (2006.01)
*H01L 43/08* (2006.01)

(52) U.S. Cl.
CPC ............ *H01L 43/08* (2013.01); *G11C 11/161* (2013.01); *H01L 43/02* (2013.01); *H01L 43/10* (2013.01); *H01L 27/222* (2013.01); *H01L 27/228* (2013.01)

(58) Field of Classification Search
CPC ......... H01L 43/02; H01L 43/08; H01L 43/10; H01L 27/222–228; G11C 11/161; G01R 33/098; G11B 5/3909
See application file for complete search history.

(56) References Cited

U.S. PATENT DOCUMENTS

| | | | |
|---|---|---|---|
| 9,680,089 B1 | 6/2017 | Chen et al. | |
| 2011/0062537 A1* | 3/2011 | Oh | B82Y 25/00 |
| | | | 257/421 |
| 2015/0171315 A1* | 6/2015 | Gan | H01F 10/3286 |
| | | | 257/421 |

* cited by examiner

*Primary Examiner* — Yu Chen
(74) *Attorney, Agent, or Firm* — Zilka-Kotab, P.C.

(57) ABSTRACT

A magnetic memory element for using in magnetic random access memory. The magnetic memory element includes a novel exchange coupling layer for use in an antiferromagnetic structure for magnetically pinning a magnetic reference layer of the memory element. The exchange coupling layer is located between a first magnetic layer (reference layer) and a second magnetic layer (keeper layer). The exchange coupling layer includes a layer of Ru located between first and second layers of Ir. The Ir layers can be in contact with each of the first and second magnetic layers to provide an interfacial magnetic anisotropy, as well as providing RKKY exchange field. The Ru layer, provides an increased RKKY exchange field as a result of the high RKKY exchange coupling of Ru.

20 Claims, 3 Drawing Sheets

MAGNETIC TUNNEL JUNCTION MEMORY ELEMENT WITH IMPROVED REFERENCE LAYER STABILITY FOR MAGNETIC RANDOM ACCESS MEMORY APPLICATION

FIELD OF THE INVENTION

The present invention relates to magnetic random access memory (MRAM) and more particularly to a magnetic memory element having a novel exchange coupling layer design for improved magnetic reference layer magnetic stability.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer are is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a magnetic memory element for use in magnetic random access memory. The memory element includes a magnetic free layer, a magnetic reference layer and a non-magnetic barrier layer located between the magnetic free layer and the magnetic reference layer. The magnetic reference layer is part of an antiferromagnetic structure that includes the magnetic reference layer, a magnetic keeper (pinning) layer and an exchange coupling structure located between the magnetic reference layer and the magnetic keeper layer. The exchange coupling structure includes a layer of Ru located between first and second layers of Ir.

In the exchange coupling structure, the layer of Ru can be thicker than either of the first and second layers of Ir. For example, the layer of Ru could have a thickness of 0.4-0.9 nm, whereas the first and second layer of Ir can each have a thickness of 0.2-0.5 nm. The first layer of Ir can be in contact with the magnetic reference layer, while the second layer of Jr can be in contact with the magnetic keeper layer. Each of, or either of, the magnetic reference layer and the magnetic keeper layer can be constructed of multi-layers of Co and Pt, Co and Pd and/or a CoFeB alloy.

The novel exchange coupling structure advantageously improves the magnetic and thermal stability of the antiferromagnetic structure by providing both high RKKY exchange field, and also providing a strong interfacial perpendicular magnetic anisotropy. Ir can interact with Co in the keeper and reference layers to provide the perpendicular magnetic anisotropy in the keeper and reference layers. Ir on its own, however, does not provide as strong of a RKKY exchange field as does Ru. By inserting only a thin layer of Ir at each interface with the keeper and reference layers, the advantages of high perpendicular interfacial magnetic anisotropy can be realized while also taking advantages of the high RKKY exchange field provided by the Ru layer. In addition, the Ir located at each interface advantageously prevents the diffusion of Co from the keeper and reference layers into the exchange coupling layer.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
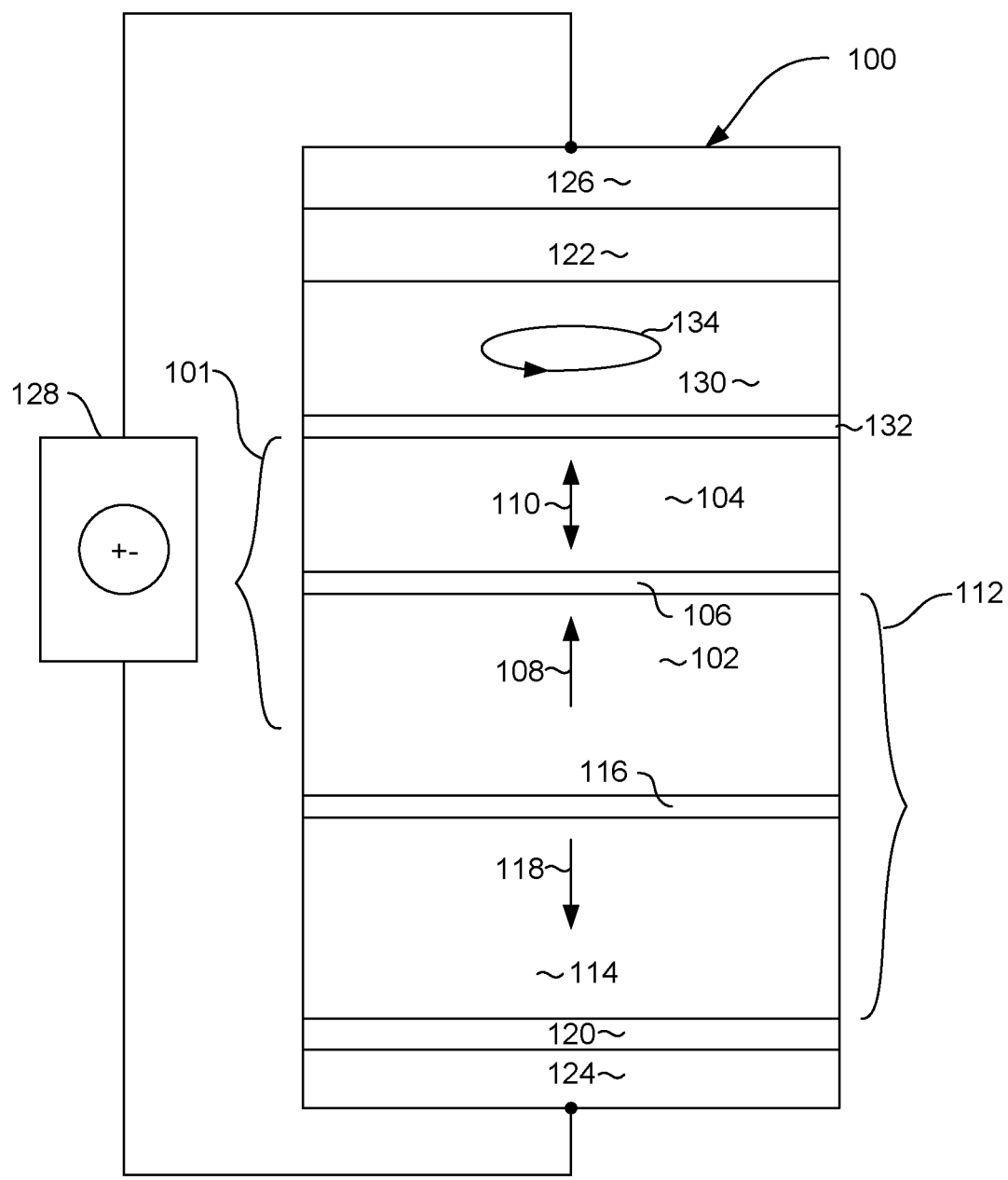
FIG. 1 is a schematic, cross sectional view of a perpendicular magnetic tunnel junction (pMTJ) element.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116, which will be described in greater detail herein below, can be constructed to have a thickness such that it will couple the layers 114, 102 in antiparallel configuration. The antiparallel coupling between the layers 114, 102 ensures that the magnetization 108 of the reference layer 102 is in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the top and bottom of the memory element 100. The electrodes 124, 126 may be constructed of a non-magnetic, electrically conductive material such as Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer 130 can be separated from the free layer 104 by a coupling layer 132. The spin polarization layer 130 has a magnetic anisotropy that causes it to have a magnetization 134 with a primary component oriented in the in-plane direction (e.g. perpendicular to the magnetizations 110, 108 of the free and reference layers 104, 102). The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
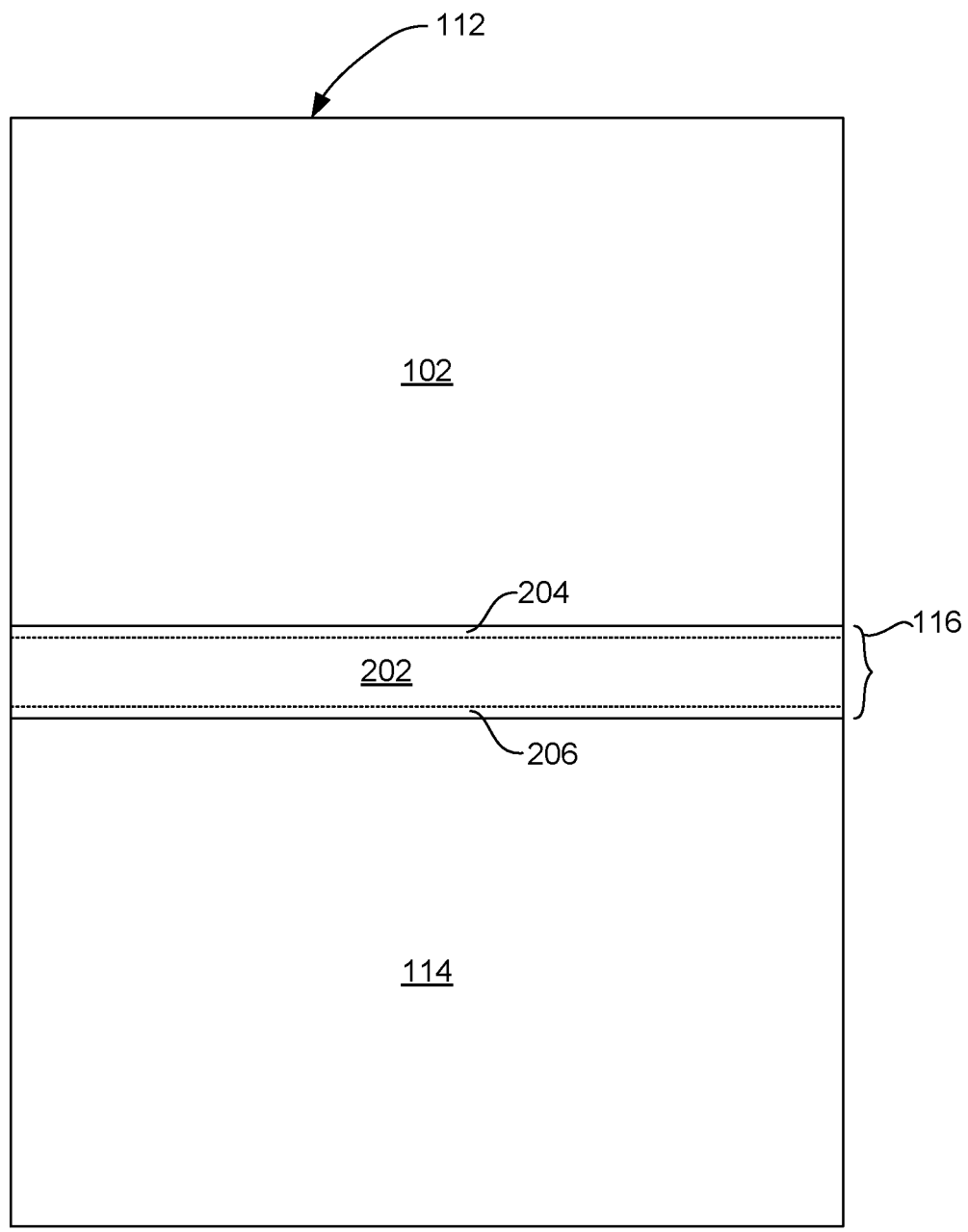
FIG. 2 is an enlarged, schematic, cross sectional view of a portion of the pMTJ element of FIG. 1.

FIG. 2 shows an enlarged view of the antiferromagnetic structure 112 in order to more clearly illustrate a novel antiparallel coupling layer 116 according to an embodiment. In FIG. 2 it can be seen that the antiparallel coupling layer 116 includes a center layer 202 that is located between upper and lower thin layers 204, 206. The central layer portion 202 is constructed of Ru, whereas the thinner upper and lower layers 204, 206 are constructed of Ir for reasons that will become clearer herein below. The upper outer layer 204 is located between the layer 202 and the reference layer 102, and the lower outer layer 206 is located between the layer 202 and the keeper layer 114. Therefore, the layer 204 is located at the junction between the antiparallel coupling structure 116 and the reference layer 102, and the layer 206 is located at a junction between the layer antiparallel coupling structure 116 and the keeper layer 114.

The keeper layer 114 and reference layer 102 can be constructed of thin, superlattice multi-layers of Co and Pt, or Co and Pd, which have shown good properties for maintaining a magnetic anisotropy in a direction perpendicular to the plane of the layers (as described above). However, such structures of the keeper layer 114 and reference layer 102 still present challenges. For example, in order to exhibit sufficient perpendicular magnetic isotropy to ensure perpendicular magnetic stability of the layers 114, 202 (for example to overcome stray magnetic fields, such as from the free layer 104 (FIG. 1)) the layers 114, 202 must constructed to be relatively thick to increase magnetic moment of the reference layer structure. However, increasing thickness of these layers 114, 202 presents manufacturing challenges with regard to shadowing effects and material redeposition when defining the magnetic element pillars. In addition, increasing the thickness of the layers 114, 202 increases the overall height of the memory element pillar 100 (FIG. 1) which makes it more difficult to increase data density as a result of the reduced distance (pitch) between pillars during the etching process due to shadowing effects.

In addition, thicker layers 114, 102 also result an increase in roughness of the layers of the magnetic memory element 100 (FIG. 1). This requires an increase in thickness of the anti-parallel spacer layer, in order to withstand certain high temperature processes needed for example to construct the CMOS electronic circuitry. However, as those skilled in the art will appreciate, an increase in thickness of the antiparallel coupling layer means that a less than optimal peak on the RKKY curve will be used, leading to reduced oscillatory exchange coupling. For example, if a Ru exchange coupling layer were used, a thickness of 8 Angstroms (second antiferromagnetic peak) would lead to much lower antiparallel exchange coupling than a Ru exchange coupling layer having a thickness of, for example, 4 Angstroms. However, an optimal "first peak" thickness of about 4 A promotes interlayer mixing between the exchange coupling layer and adjacent keeper and reference layers at temperatures of 400 degrees C. needed for annealing process.

The present invention, an embodiment of which is described with reference to FIG. 2, overcomes these challenges. The use of Ru in an exchange coupling layer can provide good, high RKKY values for fixing the magnetizations of the keeper layer 114 and reference layer 102. However, as discussed above, the use of Ru leads to interfacial mixing at high processing temperatures. This, therefore, requires the thickness of the Ru to be increased, leading to reduced exchange coupling. Replacing Ru with Ir, which provides both RKKY antiferromagnetic coupling and interfacial perpendicular magnetic anisotropy when exchange coupled with a ferromagnet such as Co has the potential to allow much thinner pinned layer and reference layer structures to achieve similar magnetic stability and magnetic moment balance to minimize stray field impact on the free layer. However, the RKKY oscillatory coupling strength of Ir alone decreases very rapidly with increasing thickness of Ir and becomes much smaller for Ir thickness above 0.4 nm compared to Ru. This means that a much thinner Ir layer would be needed compared with Ru to achieve antiferromagnetic coupling. This decreased thickness of the Ir layer presents additional challenges during material deposition and high temperature treatments due to discontinuity of the Ir layer at such small thickness. On the other hand, reducing Ru thickness only to achieve an exchange coupling strength similar to that of Ir presents disadvantages due to Ru diffusion at the interface between the Ru coupling layer and reference and keeper structures 102, 114. This is due to the material property differences between Ru and Ir when subjected to high temperatures. Ru possesses much higher solubility into the adjacent Co layers of the reference and keeper structures compared with that of Ir. This means that Ru diffuses easily into the Co while Ir provides a good Co diffusion barrier between reference and keeper layers. Therefore, using a combination of Ru and Ir as a hybrid exchange coupling layer allows the preservation of strong exchange coupling of Ru (to provide exchange coupling strength) while also providing the advantages of Ir as a diffusion barrier. As a result, a thinner Ru layer (first peak) can be used together with Ir to enhance overall antiferromagnetic coupling strength and preserve integrity of the exchange coupling layer 116 during high temperature annealing process.

The present invention as described with reference to FIG. 2, presents a hybrid structure which incorporates the benefits of both Ru and Ir in an exchange coupling structure to utilize the best properties of both materials in a synergistic manner to achieve improved reference and keeper layer 102, 114 stability even with exposure to high temperature treatment processes.

The Ir layers 204 are located at the interface between the exchange coupling layer 116 and the reference layer 102 and keeper layer 114. In addition to providing RKKY exchange coupling with these layers 102, 114, the Ir layers 204, 206 also provide an additional interfacial perpendicular magnetic anisotropy in the magnetic layers 102, 114. As discussed above, the reference layer 102 and keeper layer 114 can be constructed of multi-layers of Co/Pt or Co/Pd in a superlattice structure. Alternatively or additionally, the reference layer 102 could also comprise CoFeB. The Ir in layers 204, 206 interacts with the Co in the reference and keeper layers 102, 114 to provide this additional interfacial perpendicular magnetic anisotropy and prevent Co interdiffusion. Therefore, by providing only a thin layer 204, 206 at each interface and having a thicker layer of Ru in the center of the exchange coupling layer, the structure 116 achieves the optimal benefit of added interfacial magnetic anisotropy provided by the Ir layers 204, 206, while also taking full advantage of the higher RKKY exchange coupling provided by the Ru layer.

In the structure 116 of FIG. 2, each of the Ir layers 204, 206 can each have a thickness in a range of 0.2-0.5 nm, whereas the Ru layer 202 can have a thickness of 0.4-0.9 nm. Each of the layers 206, 202, 204 can be deposited by plasma vapor deposition sputtering during the formation of the rest of the magnetic tunnel junction stack.

Figure 3:
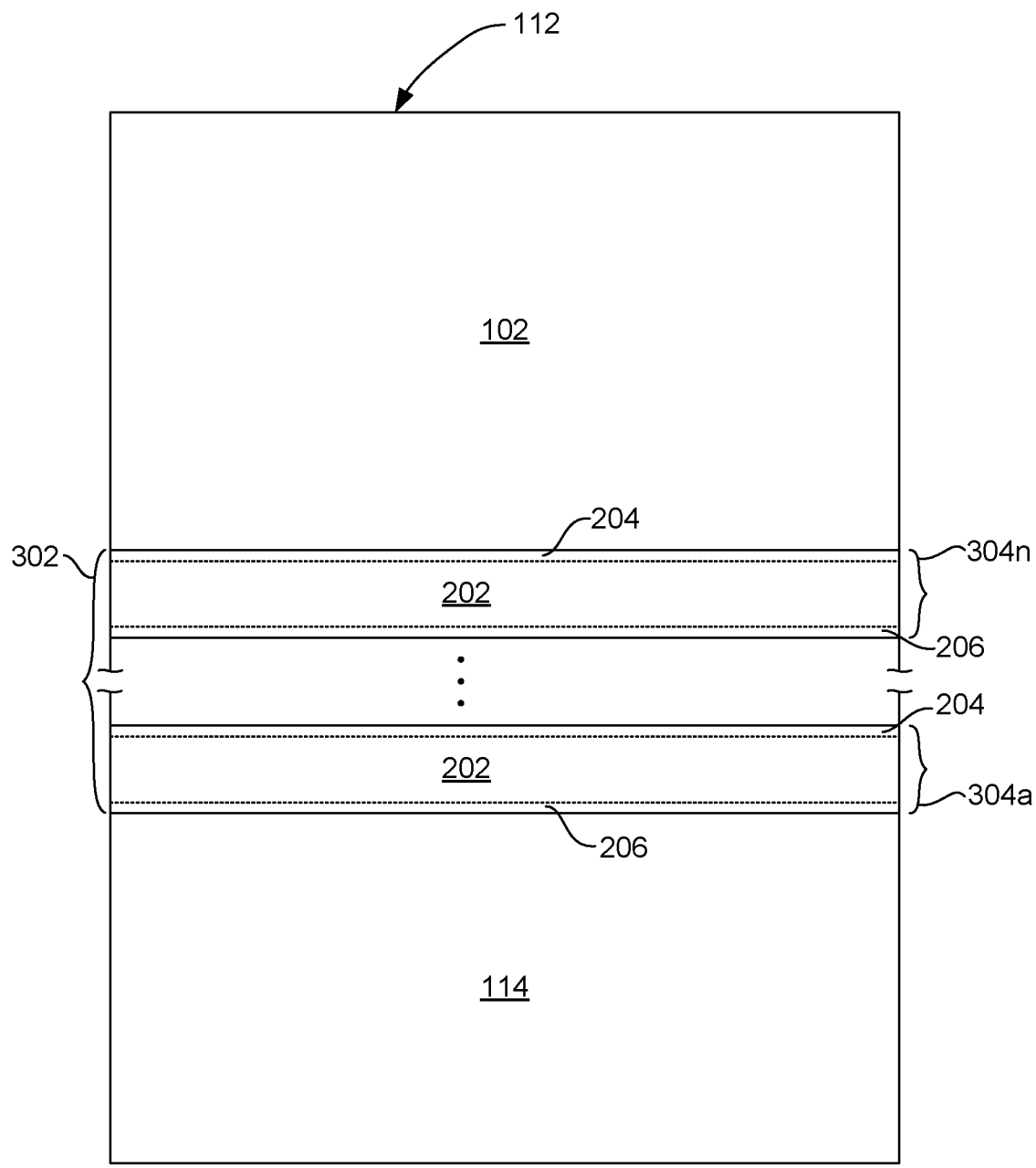
FIG. 3 is an enlarged, schematic, cross sectional view of a portion of a pMTJ element according to an alternate embodiment of the invention.

With reference now to FIG. 3, according to an alternate embodiment, the magnetic recording element structure 100 (FIG. 1) can include an exchange coupling structure 302 that is formed as a plurality of multi-layer structures. The exchange coupling structure 302 can be formed as a plurality of multi-layers 304a-304n. Each multi-layer structure 304 can include a layer of Ru 202 located between layers of Ir 204. For example, the layers of Ru 202 and layers of Ir 204 can each have a thickness of about 0.2 nm. In one embodiment, the exchange coupling structure 302 could include two multi-layer structures 304. In other embodiments the coupling structure 302 could include more than two multi-layer structures 304.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A memory element for use in a magnetic random access memory array, the memory element comprising:
   a magnetic free layer;
   a magnetic reference layer; and
   a non-magnetic barrier layer located between the magnetic free layer and the magnetic reference layer, wherein the magnetic reference layer is part of an antiferromagnetic structure that further comprises:
   the magnetic reference layer;
   a magnetic pinning layer; and
   an exchange coupling structure located between the magnetic reference layer and the magnetic pinning layer, the exchange coupling layer comprising a layer of Ru located between first and second layers of Ir.

2. The memory element as in claim 1, wherein the layer of Ru is thicker than either of the first and second layers of Ir.

3. The memory element as in claim 1, wherein the layer of Ru has a thickness of 0.4-0.9 nm and each of the first and second layers of Ir has a thickness of 0.2-0.5 nm.

4. The memory element as in claim 1, wherein the first layer of Ir is in contact with the magnetic reference layer and the second layer of Ir is in contact with the magnetic pinning layer.

5. The memory element as in claim 1, wherein the reference layer comprises multi-layers of Co and Pt, in a super lattice structure.

6. The memory element as in claim 1, wherein the magnetic pinning layer comprises multi-layers of Co and Pt in a super lattice structure.

7. The memory element as in claim 1, wherein the magnetic reference layer comprises a CoFeB alloy.

8. The memory element as in claim 1, wherein the magnetic keeper layer comprises multi-layers of Co and Pd in a supper lattice structure.

9. The memory element as in claim 1, wherein the exchange coupling structure results in both an exchange coupling field and an interfacial perpendicular magnetic anisotropy that keeps the magnetic reference layer and the magnetic pinning layer magnetized in opposite directions in an orientation that is perpendicular to the plane of the magnetic reference layer and the magnetic pinning layer.

10. The magnetic memory element as in claim 1, wherein the exchange coupling structure further comprises additional multi-layer structures, each further including a layer of Ru located between layers of Ir.

11. A magnetic random access memory system, comprising:
   a plurality of memory elements formed in an array; and
   circuitry connected with the plurality of memory elements, the circuitry being configured to write data to the memory elements and read data from the memory elements, each of the memory elements further comprising:
   a magnetic free layer;
   a magnetic reference layer; and
   a non-magnetic barrier layer located between the magnetic free layer and the magnetic reference layer, wherein the magnetic reference layer is part of an antiferromagnetic structure that further comprises:
   the magnetic reference layer;
   a magnetic pinning layer; and
   an exchange coupling structure located between the magnetic reference layer and the magnetic pinning layer, the exchange coupling layer comprising a layer of Ru located between first and second layers of Ir.

12. The magnetic random access memory system as in claim 11, wherein the layer of Ru is thicker than either of the first and second layers of Ir.

13. The magnetic random access memory system as in claim 11, wherein the layer of Ru has a thickness of 0.4-0.9 nm and each of the first and second layers of Ir has a thickness of 0.2-0.5 nm.

14. The magnetic random access memory system as in claim 11, wherein the first layer of Ir is in contact with the magnetic reference layer and the second layer of Ir is in contact with the magnetic pinning layer.

15. The magnetic random access memory system as in claim 11, wherein the reference layer comprises multi-layers of Co and Pt in a super lattice structure.

16. The magnetic random access memory system as in claim 11, wherein the magnetic pinning layer comprises multi-layers of Co and Pt in a super lattice structure.

17. The magnetic random access memory system as in claim 11, wherein the magnetic reference layer comprises a CoFeB alloy.

18. The magnetic random access memory system as in claim 11, wherein the magnetic keeper layer comprises multi-layers of Co and Pd in a supper lattice structure.

19. The magnetic random access memory system as in claim 11, wherein the exchange coupling structure results in both an exchange coupling field and an interfacial perpendicular magnetic anisotropy that keeps the magnetic reference layer and the magnetic pinning layer magnetized in opposite directions in an orientation that is perpendicular to the plane of the magnetic reference layer and the magnetic pinning layer.

20. The magnetic memory element as in claim 11, wherein the exchange coupling structure further comprises additional multi-layer structures, each further including a layer of Ru located between layers of Ir.

* * * * *

UNITED STATES PATENT AND TRADEMARK OFFICE
CERTIFICATE OF CORRECTION

| | |
|---|---|
| PATENT NO. | : 10,879,454 B2 |
| APPLICATION NO. | : 16/058836 |
| DATED | : December 29, 2020 |
| INVENTOR(S) | : Bartlomiej Adam Kardasz et al. |

It is certified that error appears in the above-identified patent and that said Letters Patent is hereby corrected as shown below:

In the Specification

Column 2, Line 54 please replace "Jr" with --Ir--.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*